US012620949B2

(12) United States Patent
Lloyd

(10) Patent No.: US 12,620,949 B2
(45) Date of Patent: May 5, 2026

(54) AMPLIFIER CIRCUIT ARRANGEMENT AND ELECTRONIC DEVICE

(71) Applicant: Rohde & Schwarz GmbH & Co. KG, Munich (DE)

(72) Inventor: Paul Gareth Lloyd, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 283 days.

(21) Appl. No.: 18/303,781

(22) Filed: Apr. 20, 2023

(65) Prior Publication Data

US 2023/0370034 A1     Nov. 16, 2023

Related U.S. Application Data

(60) Provisional application No. 63/341,016, filed on May 12, 2022.

(51) Int. Cl.
H03F 1/02          (2006.01)
H03F 1/56          (2006.01)
(Continued)

(52) U.S. Cl.
CPC ........... H03F 3/245 (2013.01); H03F 1/0288 (2013.01); H03F 1/565 (2013.01); H03F 3/604 (2013.01);
(Continued)

(58) Field of Classification Search
CPC ..................................... H03F 1/02; H03F 1/07
(Continued)

(56) References Cited

U.S. PATENT DOCUMENTS

| | | | |
|---|---|---|---|
| 4,025,924 | A | 5/1977 | Luedtke et al. |
| 4,656,434 | A | 4/1987 | Selin |

(Continued)

FOREIGN PATENT DOCUMENTS

| | | |
|---|---|---|
| EP | 1609239 B1 | 7/2010 |
| GB | 2533824 A | 7/2016 |

OTHER PUBLICATIONS

Website Article, "Diode Clipping Circuits", Retrieved from the Internet: https://www.electronics-tutorials.ws/diode/diode-clipping-circuits.html, n.d., 5 pages.

(Continued)

*Primary Examiner* — Henry Choe

(74) *Attorney, Agent, or Firm* — Westman, Champlin & Koehler, P.A.

(57)          ABSTRACT

An amplifier circuit arrangement for amplifying at least one input signal to an output signal for delivery to a load. The amplifier circuit arrangement includes at least one four-port hybrid coupler, a main amplifier having an input terminal for receiving a first input signal and coupled to a first port of the hybrid coupler, an auxiliary amplifier having an input terminal for receiving a second input signal and coupled to the second port of the hybrid coupler, a negative resistance amplifier circuit coupled to the third port of the hybrid coupler. The negative resistance amplifier circuit receives a signal from the hybrid coupler via the third port and returns an amplified signal back to the third port of the hybrid coupler. At least one of the auxiliary amplifier and negative resistance amplifier circuit selectively operates in combination with the main amplifier circuit.

20 Claims, 8 Drawing Sheets

(51) Int. Cl.
  *H03F 3/24*            (2006.01)
  *H03F 3/60*            (2006.01)

(52) U.S. Cl.
  CPC .. *H03F 2200/198* (2013.01); *H03F 2200/451*
                                          (2013.01)

(58) Field of Classification Search
  USPC ............................................ 330/124 R, 295
  See application file for complete search history.

(56)                  References Cited

U.S. PATENT DOCUMENTS

| | | |
|---|---|---|
| 6,297,696 B1 | 10/2001 | Abdollahian et al. |
| 6,394,362 B1 | 5/2002 | Kramr |
| 8,957,734 B2 | 2/2015 | Ahmed et al. |
| 10,749,478 B2 | 8/2020 | Hou et al. |
| 2005/0134377 A1 | 6/2005 | Dent |
| 2011/0095827 A1 | 4/2011 | Tanaka et al. |
| 2013/0093509 A1 | 4/2013 | Cabrera et al. |
| 2015/0028945 A1 | 1/2015 | Gaynor |

| | | |
|---|---|---|
| 2015/0145602 A1 | 5/2015 | Felgentreff et al. |
| 2016/0056776 A1 | 2/2016 | Fröhlich et al. |
| 2019/0158030 A1 | 5/2019 | Hou et al. |
| 2024/0283406 A1 | 8/2024 | Hou et al. |

OTHER PUBLICATIONS

Quaglia, R. et al., "Load-Modulated Balanced Amplifier", IEEE microwave magazine, Dec. 2022, 11 pages.
Collins D., et al., "The Orthogonal LMBA: A Novel RFPA Architecture With Broadband Reconfigurability", IEEE Microwave and Wireless Components Letters, vol. 30, No. 9, Sep. 2020, 4 pages.
U.S. Appl. No. 18/300,723, filed Apr. 14, 2023, entitled "RF amplifier circuit arrangement and electronic device", 50 pages.
Cao et al., "Load Modulated Balanced Amplifier with Reconfigurable Phase Control for Extended Dynamic Range", 2018 IEEE/MTT-S International Microwave Symposium. (Year: 2019).
Diode Clipping Circuit, https://www.eeeguide.com/shunt-clipping-circuits/ (Year: 2020).
Office Action from U.S. Appl. No. 18/300,723, dated Sep. 30, 2025, 16 pages.
Notice of Allowance for U.S. Appl. No. 18/300,723, dated Feb. 10, 2026, 8 pages.

AMPLIFIER CIRCUIT ARRANGEMENT AND ELECTRONIC DEVICE

CROSS-REFERENCE TO RELATED APPLICATION

This application claims the benefit of U.S. provisional application No. 63/341,016, filed on May 12, 2022, the content of which is hereby incorporated by reference in its entirety.

TECHNICAL FIELD

The present invention relates to an amplifier circuit arrangement for amplifying at least one input signal to an output signal for delivery to a load. The present invention further relates to an electronic device.

BACKGROUND OF THE INVENTION

Although applicable in principle to any amplifier, the present invention and its underlying problem will be hereinafter described in conjunction with amplification of radio frequency (RF) signals, in particular for use in a wireless communication systems.

In particular in a wireless communication system, a transmitter employs power amplifiers to boost signal power for radio transmission. To be efficient in occupying frequency spectrum, modern communication signals have a large peak-to-average power ratio (PAR). The capability to reach peak power and to maintain energy efficiency at the average power levels is contradictory for conventional single branch power amplifiers. More sophisticated power amplifier architectures employ multiple power amplifier branches to satisfy both the power and the efficiency requirements. Among these power amplifier architectures, the most widely used in wireless infrastructures is the so-called Doherty power amplifier.

A Doherty power amplifier consists of at least two power amplifier branches, namely a main branch and an auxiliary branch. In operation, an auxiliary power amplifier in the auxiliary branch injects power into a main power amplifier in the main branch in order to modulate its effective load impedance according to a specific pattern such that total efficiency is maximized not only at the peak-power but also at the average-power level.

A so-called 3-way Doherty power amplifier comprises three power amplifier branches, namely a main power amplifier and two auxiliary power amplifiers. The first auxiliary power amplifier modulates the load of the main power amplifier the same as that in a 2-way Doherty power amplifier, to maximize efficiency at the low and medium power levels. The second auxiliary power amplifier modulates the loads of both the main and first auxiliary power amplifiers to maximize efficiency at the peak power level. As a result, total efficiency at three different power levels can be maximized. The energy saving is considerable in high PAR applications.

U.S. Pat. No. 10,749,478 B2 describes an amplifier arrangement similar to the 3-way Doherty power amplifier described above. This amplifier circuit arrangement comprises a main branch and two auxiliary power amplifiers that are selectively operated. Suitable input signals are provided to each one of the main and auxiliary power amplifiers. The generation of these input signals, however, is not trivial and needs complex calculation and synthesizing effort. This applies particularly to the input signals provided to the auxiliary power amplifier that is coupled to the isolated port of the hybrid coupler.

The solution described in U.S. Pat. No. 10,749,478 B2 uses an active signal injection into the isolated port of the hybrid coupler. The required signal conditioning and shaping of this signal is complex since the distortion characteristic incident to the isolated port must match the signal emerging from it. Basically, the generation of the injected signal correspond to some kind of "predictive post-correction" which needs a very complex calculation.

The calculation and synthesis of the input signals needs significant calculation effort which goes to the expense of the performance. The challenge of maintaining high performances in particular for high efficiency amplification, however, makes the whole power amplifier circuit arrangement expensive.

Against this background, there is the need to provide a more efficient, simplified power amplifier circuit arrangement with improved performance and at the same time reduced complexity and cost.

SUMMARY OF THE INVENTION

The present invention provides an amplifier circuit arrangement and an electronic device having the features of the independent claims.

According to a first aspect, an amplifier circuit arrangement for amplifying at least one input signal to an output signal for delivery to a load is provided, the amplifier circuit arrangement comprising: at least one four-port hybrid coupler, a main amplifier having an input terminal for receiving a first input signal and being coupled to a first port of the hybrid coupler, an auxiliary amplifier having an input terminal for receiving a second input signal and being coupled to the second port of the hybrid coupler, a negative resistance amplifier circuit being coupled to the third port of the hybrid coupler, wherein the negative resistance amplifier circuit is configured to receive a signal from the hybrid coupler via the third port and to return an amplified signal thereof back to the third port of the hybrid coupler, wherein at least one of the auxiliary amplifier and the negative resistance amplifier circuit being selectively operable to operate in combination with the main amplifier circuit.

According to a second aspect, an electronic device is provided, the electronic device comprising an amplifier circuit arrangement for amplifying at least one input signal to an output signal for delivery to a load, the amplifier circuit arrangement comprising: at least one four-port hybrid coupler, a main amplifier having an input terminal for receiving a first input signal and being coupled to a first port of the hybrid coupler, an auxiliary amplifier having an input terminal for receiving a second input signal and being coupled to the second port of the hybrid coupler, a negative resistance amplifier circuit being coupled to the third port of the hybrid coupler, wherein the negative resistance amplifier circuit is configured to receive a signal from the hybrid coupler via the third port and to return an amplified signal thereof back to the third port of the hybrid coupler, wherein at least one of the auxiliary amplifier and the negative resistance amplifier circuit being selectively operable to operate in combination with the main amplifier circuit.

The present invention is based on the knowledge that calculating and synthesizing a specific injection signal for a power amplifier at the third port of a hybrid coupler is tremendously complex and needs extensive calculation effort which should be avoided in order to maintain high efficiency and at the same time high performance. The present invention is now based on the finding that a specific auxiliary power amplifier at the third port that is driven by an external input signal is not necessarily needed and may be replaced by a suitable reflection element. By using a nega- tive resistance amplifier which uses the signal already pro- vided at the third port of the hybrid coupler as an input signal and which reflects this signal or an amplified signal derived from this signal back to the third port, a very simple and at the same time highly efficient amplifier architecture is provided.

This means that the third port is somewhat silent, which means that no externally generated injection signal is required for this port, so that also a corresponding calcula- tion effort is not applicable.

The advantage of the present invention is to overcome the loss of the reflective termination, and even to replace it with an active gain, i.e. a reflection coefficient greater than or equal to 1. In particular, the reflection coefficient is variable, preferably between 0 and any user defined value. The high reflection coefficient enables a higher efficiency of operation especially while the reflection amplifier requires only a comparably low reflection gain.

A further benefit of the present invention is that no prediction nor synthesis effort is needed for the calculation of an external injection signal since the negative reflection amplifier uses an already existing signal that is coming out of the third port of the hybrid coupler, and reflects it back to the same third port.

According to the embodiments herein, power from two power amplifiers and one negative reflection amplifier are combined to achieve Doherty load modulation by only one single hybrid coupler which is a single coupling structure. Compared with known 3-way Doherty power amplifiers with coupler combiners, the power amplifier circuit arrange- ment according to the aspects described herein reduce the number of coupler structures from two to one. As a result, the power loss, size, complexity and cost associated with coupler structures are also reduced.

Advantageous configurations and developments emerge from the further dependent claims and from the description with reference to the figures of the drawings.

According to a further aspect, the amplifier circuit arrangement further comprises an output terminal connected to the fourth port for providing the output signal. This output terminal forms the only "real" output terminal of the hybrid coupler and is configured to couple the amplifier circuit arrangement to an external load.

According to a further aspect, the third port is an isolated port (or isolation port) of the hybrid coupler. It goes without saying, that the third port may also be another port of the hybrid coupler. This isolated port provides an isolation limitation or termination of the amplifier circuit arrange- ment.

According to one embodiment, the negative resistance amplifier circuit comprises a first and a second terminal wherein the first terminal acts as well as input and output terminal of the negative resistance amplifier circuit which is coupled to the third port of the hybrid coupler. The second terminal is coupled to a reference voltage that may be ground voltage.

According to another embodiment, the negative resistance amplifier circuit comprises a RF reflection amplifier.

According to a further embodiment, the negative resis- tance amplifier circuit comprises at least one IMPATT diode. An IMPATT diode (impact ionization avalanche transit-time diode) is a form of high-power semiconductor diode often used in high-frequency microwave electronics devices. They provide a negative resistance and can be used as amplifiers at microwave frequencies. In electronics, negative resistance denotes the property of some electrical circuits and devices in which an increase in voltage across the device's input and output terminals results in a decrease in electric current through it. IMPATT diodes operate at frequencies of about 3 GHz and 100 GHz, or higher. The main advantage is their high-power capability.

According to a further embodiment, the negative resis- tance amplifier circuit comprises at least one circulator circuit that is connected to an output of a reflection amplifier or another circulator circuit. A circulator is a passive, non-reciprocal three- or four-port device that only allows a microwave or RE signal to exit through the port directly after the one it entered. Ports are where an external wave- guide or transmission line, such as a coaxial cable, connects to the device. For a three-port circulator, an input signal applied to a first port only comes out of the second port, an input signal applied to the second port only comes out of the third port, and so on.

In a preferable configuration, the negative resistance amplifier circuit comprises a plurality of circulators and reflection amplifiers which are connected sequentially such as in a Daisy chain configuration. A circulator and at least one reflection amplifier form a reflection pair that are connected in series with other reflection pairs of the same or similar design, whereby the circuit termination of this sort of series connection can be formed by one or more reflection amplifiers. A respective reflection amplifier can in turn be designed as an IMPATT diode.

According to a further aspect, the amplifier circuit arrangement is a single-input-single-output amplifier. The amplifier circuit arrangement further comprises a power splitter (also referred to as a power divider). The power splitter is configured to split a received input signal received by the power splitter into the first input signal and the second input signal. The splitted first and second input signals are then fed to the respective input terminals of the main amplifier and auxiliary amplifier, respectively.

In a preferable configuration, the power splitter is an uneven 3-way Wilkinson splitter or Wilkinson power divider. In the field of microwave engineering, a Wilkinson power divider stands for a specific type power divider circuits that can achieve isolation between the output ports while maintaining a matched condition on all ports.

According to a further aspect, the hybrid coupler com- prises at least one of: a Branch-line coupler, a lumped elements coupler, a coupled-line coupler and/or a Lange coupler. The most common form of directional coupler is a pair of coupled transmission lines which then form a coupled-line coupler. They can be realised in a number of technologies including coaxial and planar technologies. The Branch-line coupler consists of two parallel transmission lines physically coupled together with two or more branch lines between them. The branch lines are spaced λ/4 apart and represent sections of a multi-section filter design in the same way as the multiple sections of a coupled-line coupler except that here the coupling of each section is controlled with the impedance of the branch lines. The construction of the Lange coupler is similar to the interdigital filter with paralleled lines interleaved to achieve the coupling.

According to a further aspect, the hybrid coupler is a quadrature coupler which preferably comprises a 3-dB quadrature hybrid combiner.

According to a further aspect, the hybrid coupler is a ring hybrid coupler. A hybrid coupler, also called rat-race coupler or hybrid ring coupler, is a four-port 3 dB directional coupler consisting of a 3λ/2 ring of transmission line with four lines at the intervals. This kind of hybrid coupler is often used in RF and microwave systems. In its simplest form, it is a 3 dB coupler which in contrast to a magic T-coupler is easy to realize in planar technologies. Hybrid ring couplers do not necessarily need matching structures to achieve correct operation.

According to a further aspect, the amplifier circuit arrangement further comprises at least one matching network. Each matching network is coupled to a respective one of the four ports of the hybrid coupler in order to perform impedance transformation, wherein at least one of the matching networks comprises a transmission line or a lumped element.

According to a further aspect, a characteristic impedance of the hybrid coupler is configured to match a loading impedance of the load.

According to a further aspect, the amplifier circuit arrangement comprises a shaping filter coupled between the negative resistance amplifier and the third port. This makes it possible that the critical isolated third port is terminated with a negative resistance amplifier or in particular a reflection amplifier and at the same time optional shaping filter structures can be provided. The used shaping filter structures may then be designed much more simpler.

According to a further aspect, the negative resistance amplifier comprises a control terminal for receiving a control signal. The negative resistance amplifier is configured such to set a predetermined magnitude of the reflection coefficient depending on the received control signal. This way, the reflection coefficient is programmable, tuneable or settable depending on the actual needs.

According to a further aspect, the gain of the negative resistance amplifier is below 3 dB and in particular in the range of about 1 dB or below. A gain of the negative resistance amplifier of the order of about 1 dB is sufficient to overcome the loss of the matching network of the reflection amplifier. This is less expensive and more efficient than known solutions as described in the background part which need gains in the order of 20 db or more.

According to a particular preferred configuration of the electronic device, the electronic device comprises at least on one of: a radio transmitter, a TV transmitter, a radio base station, a bargaining chip and/or a broadband amplifier.

Where appropriate, the above-mentioned configurations and developments can be combined in any manner. Further possible configurations, developments and implementations of the invention also include combinations, which are not explicitly mentioned, of features of the invention which have been described previously or are described in the following with reference to the embodiments. In particular, in this case, a person skilled in the art will also add individual aspects as improvements or supplements to the basic form of the present invention.

CONTENT OF THE DRAWINGS

The present invention is described in greater detail in the following on the basis of the embodiments shown in the schematic figures of the drawings, in which.

6

Figure 2A:
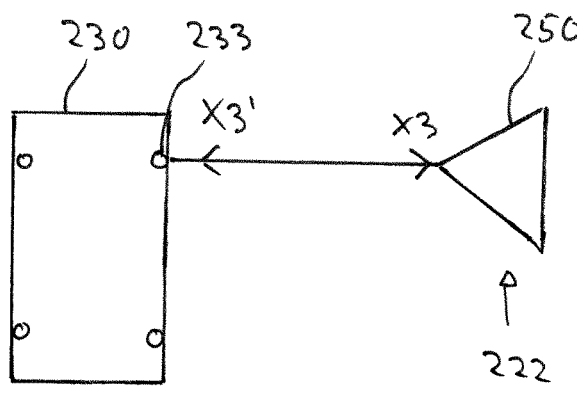
FIG. 2A is a schematic circuitry illustrating a first embodiment of a negative resistance amplifier circuit.
Figure 2B:
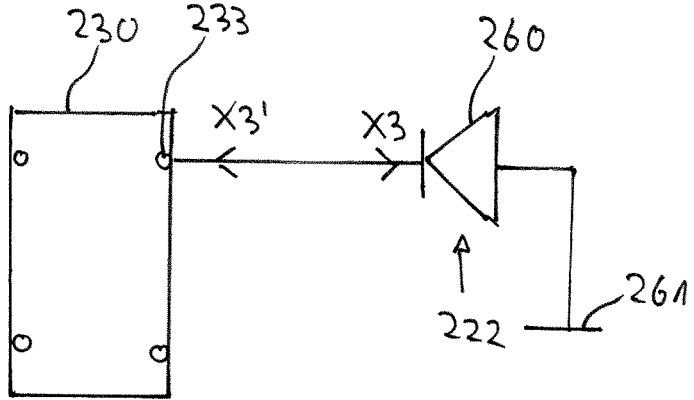
FIG. 2B is a schematic circuitry illustrating a second embodiment of a negative resistance amplifier circuit.
Figure 2C:
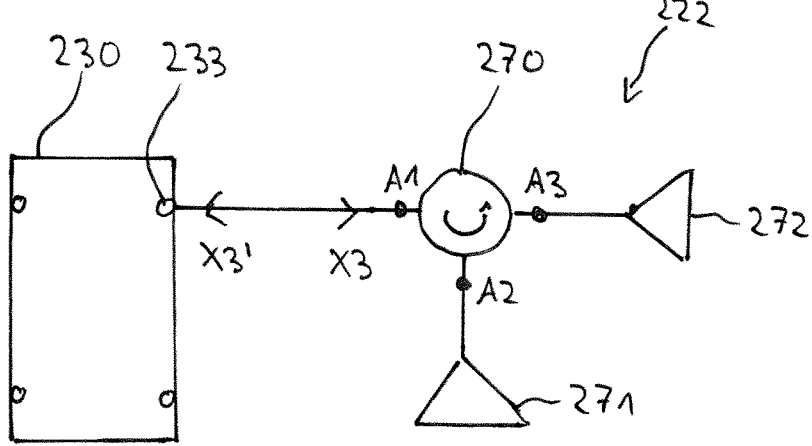
Figure 2D:
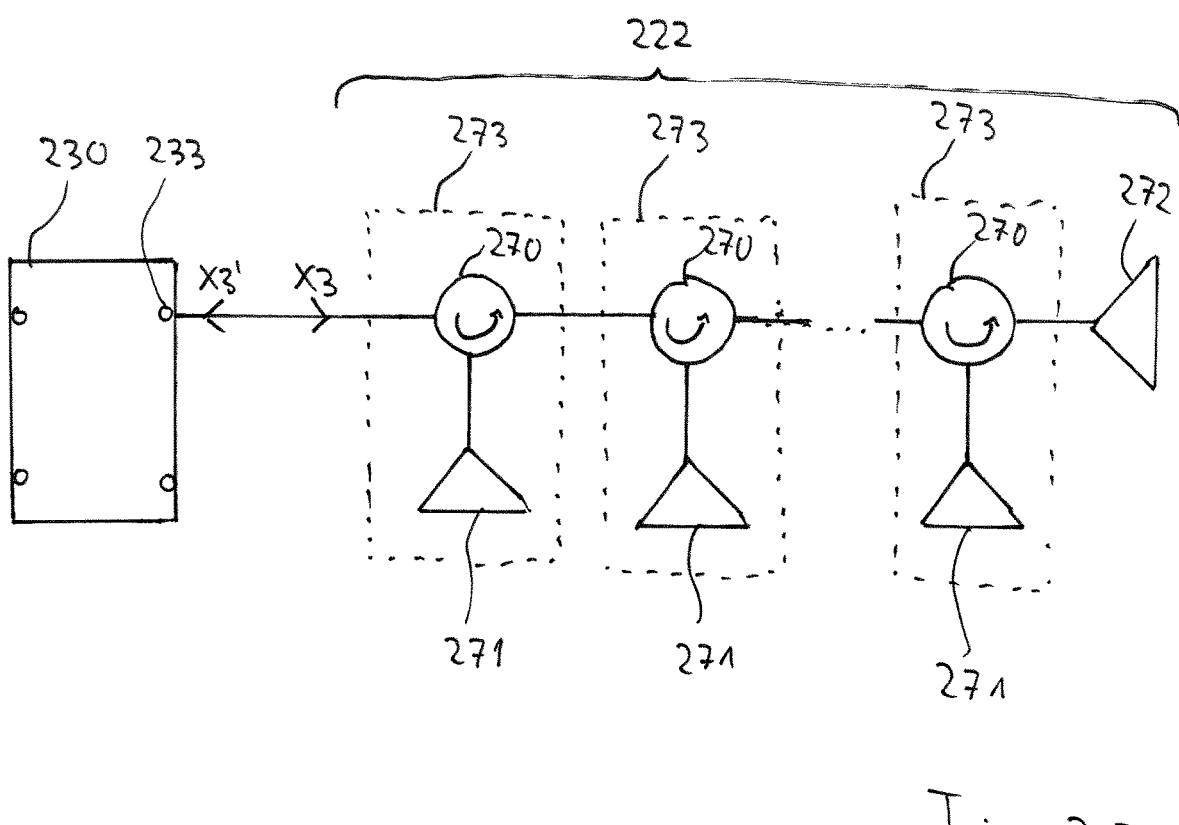
Figure 2E:
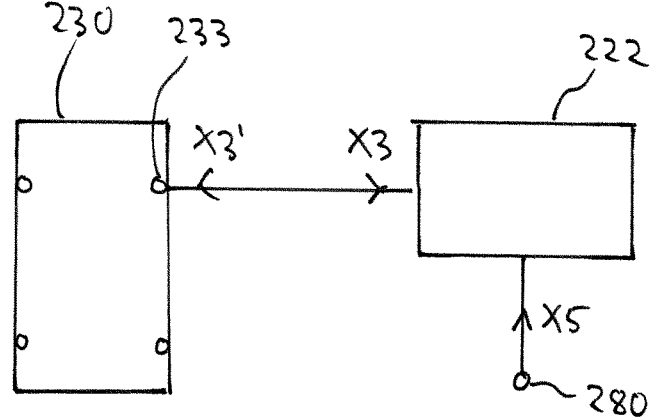
Figure 3:
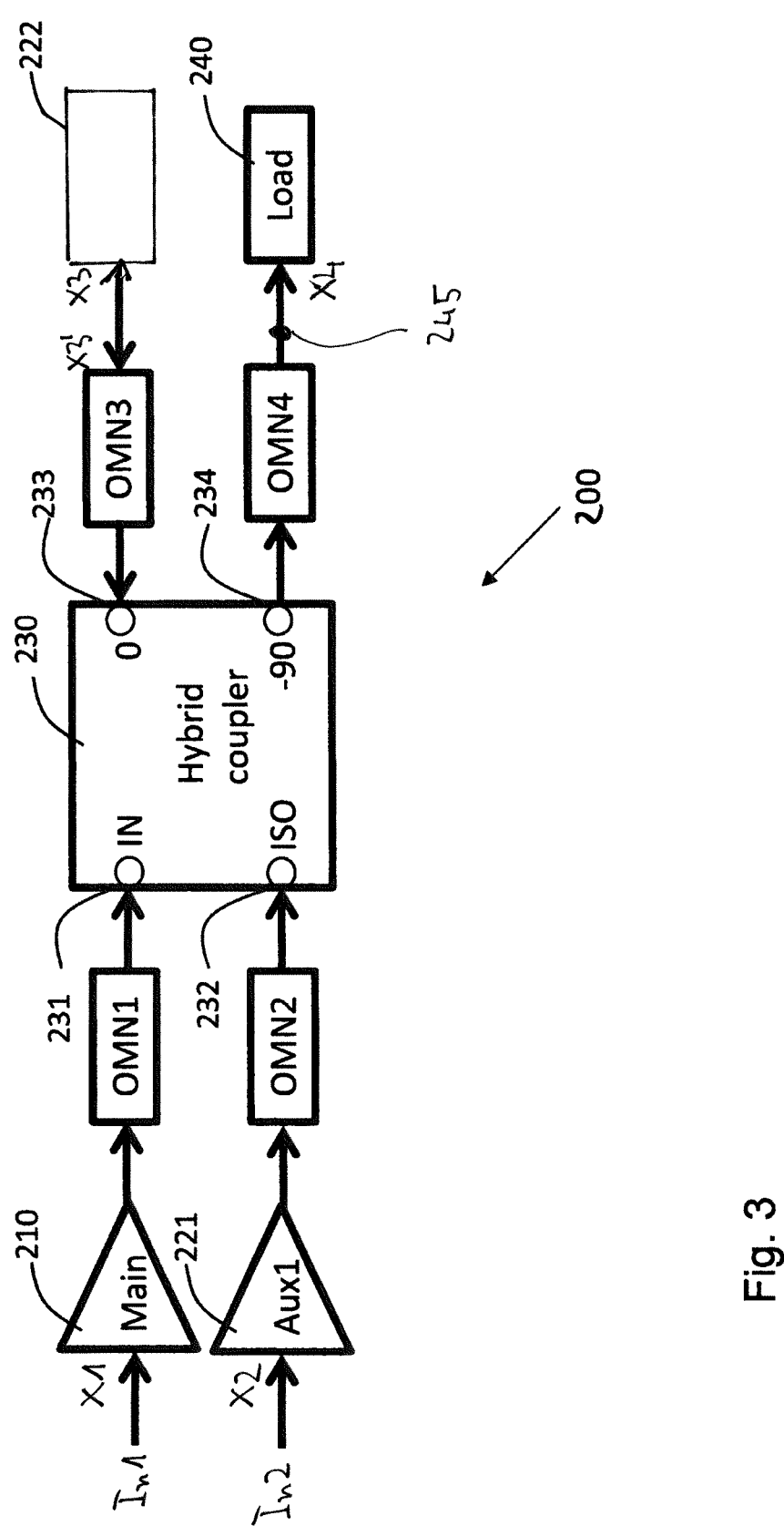
Figure 4:
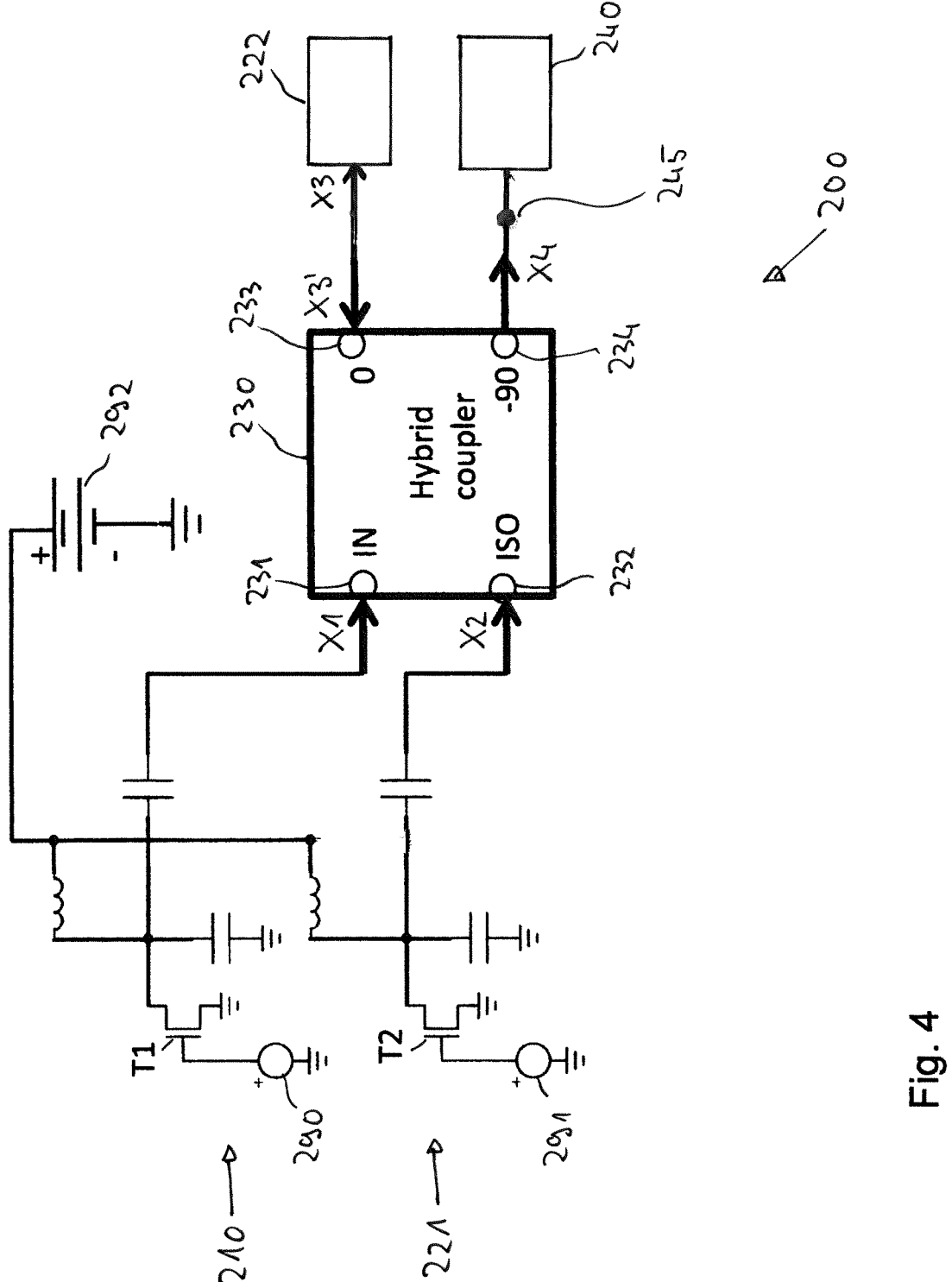
Figure 5:
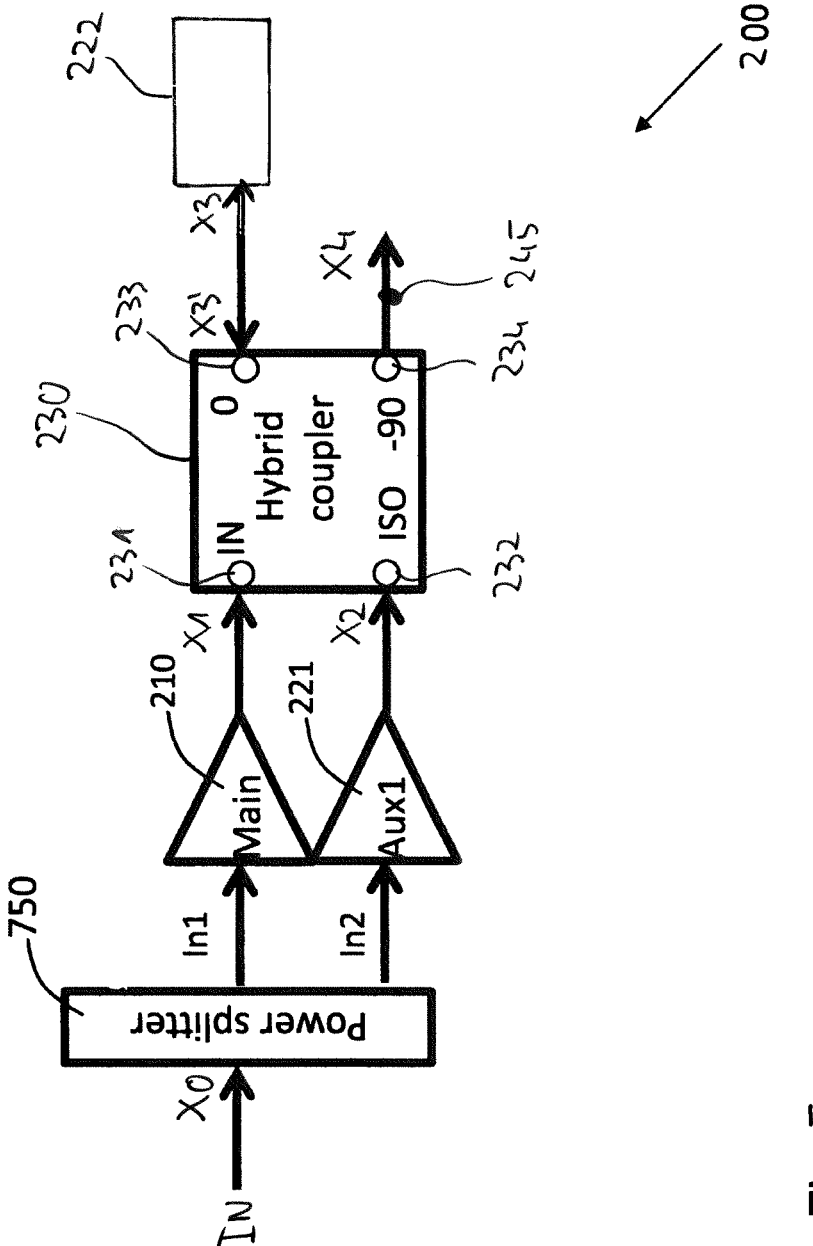
Figure 6:
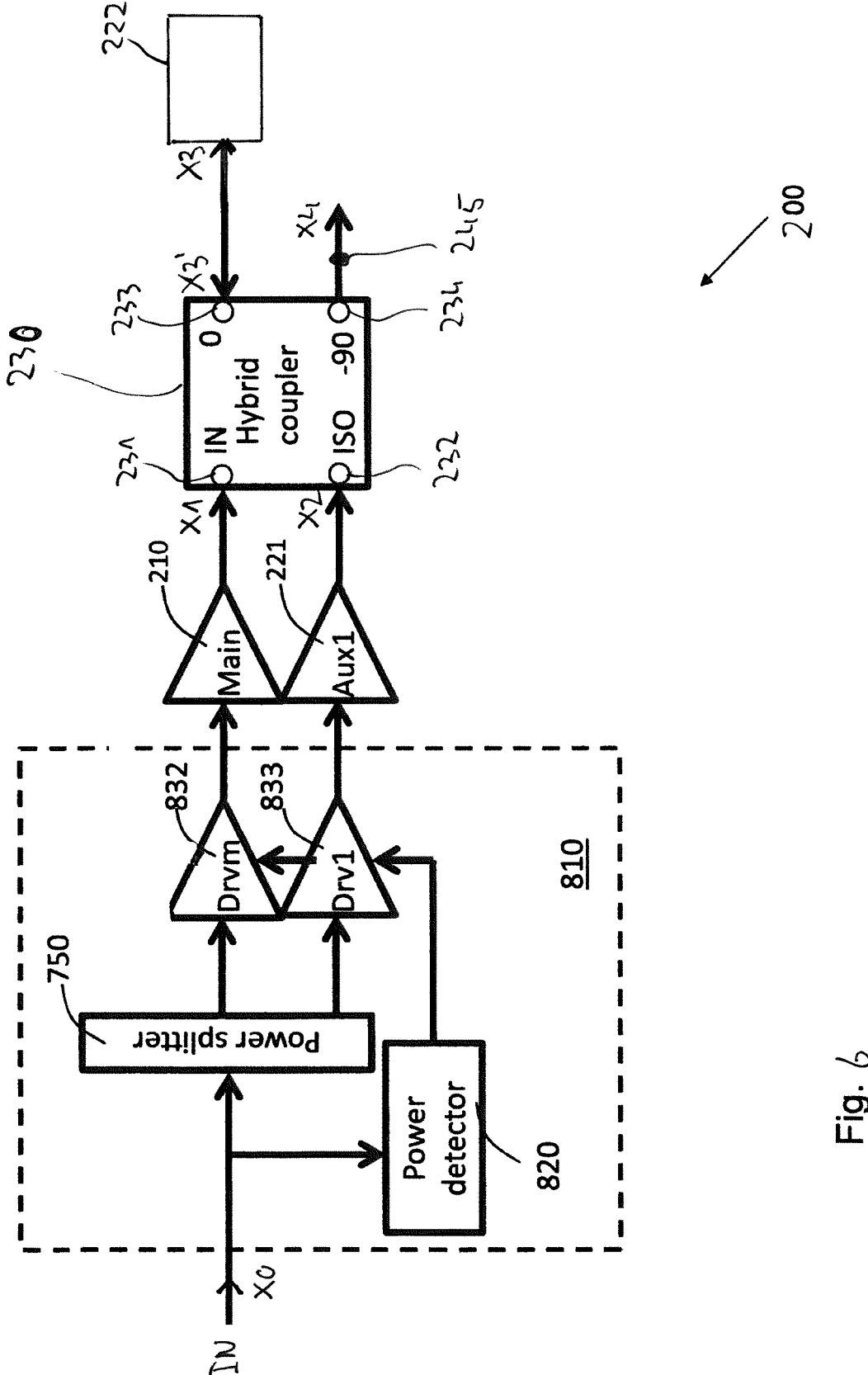
Figure 7:
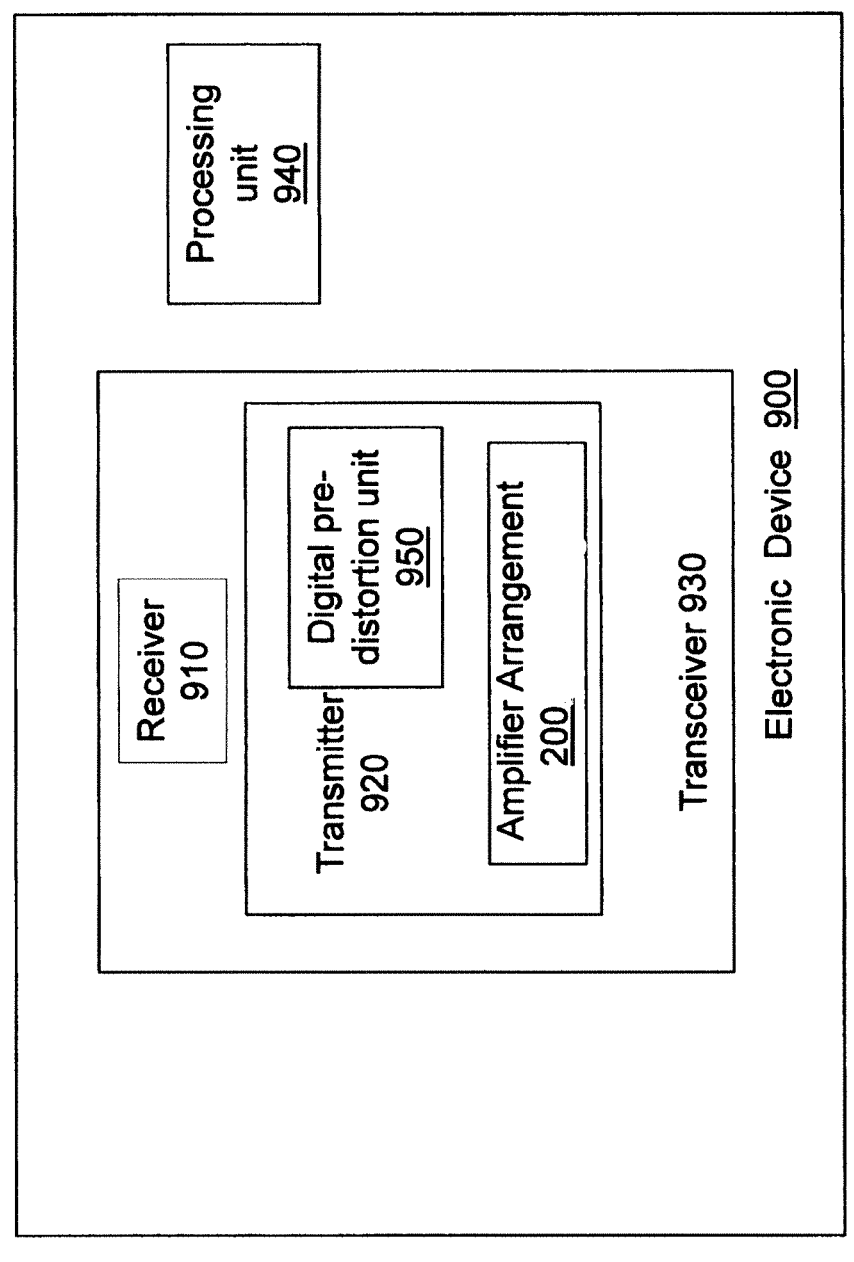

FIG. 2C is a schematic circuitry illustrating a third embodiment of a negative resistance amplifier circuit;

FIG. 2D is a schematic circuitry illustrating a fourth embodiment of a negative resistance amplifier circuit;

FIG. 2E is a schematic circuitry illustrating a fifth embodiment of a negative resistance amplifier circuit FIG. 3 is a schematic block diagram illustrating an amplifier circuit arrangement according to a further aspect;

FIG. 4 is a schematic block diagram illustrating a more detailed amplifier circuit arrangement according to a further aspect;

FIG. 5 is a schematic block diagram illustrating an amplifier circuit arrangement according to a further aspect;

FIG. 6 is a schematic block diagram illustrating an amplifier circuit arrangement according to a further aspect;

FIG. 7 is a schematic block diagram illustrating an electronic device in which an amplifier circuit arrangement according to aspects of the present invention is implemented.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DESCRIPTION OF EMBODIMENTS

Figure 1:
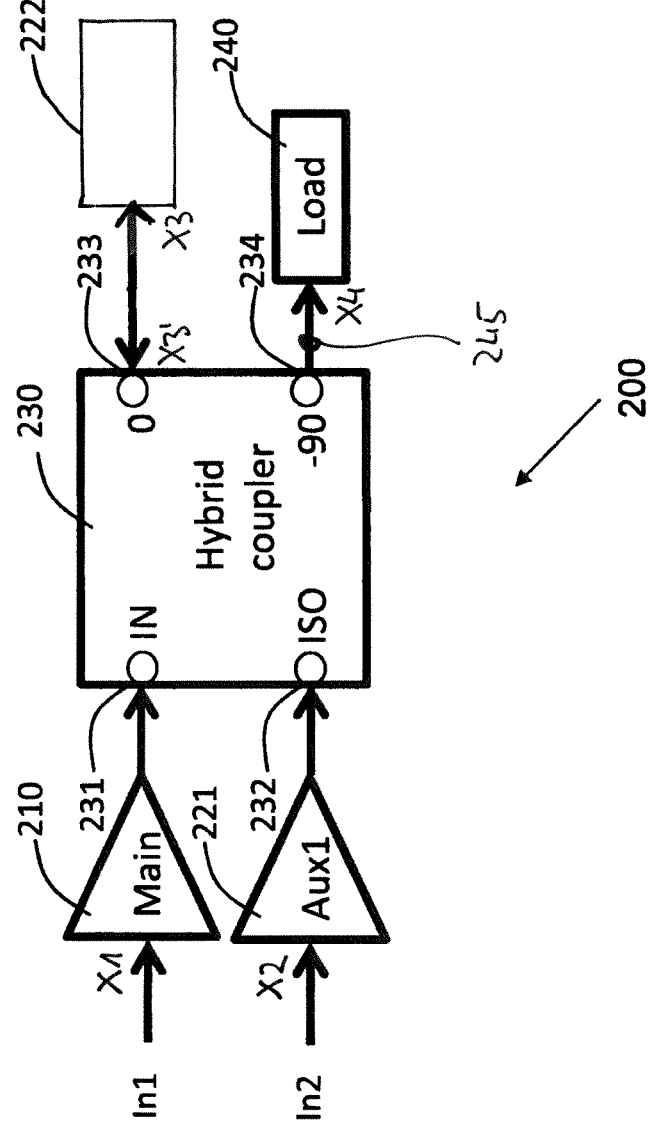
FIG. 1 is a schematic block diagram illustrating an amplifier circuit arrangement according to a first aspect.

FIG. 1 shows a schematic block diagram illustrating an amplifier circuit arrangement according to a first aspect of the present invention.

In FIG. 1, the amplifier circuit arrangement is denoted by reference numeral 200. The amplifier circuit arrangement 200 is configured for amplifying input signals, e.g. two separate input signals X1, X2, to one output signal X4, which is provided via the output terminal 245 to a load 240.

The objective of the amplifier circuit arrangement 200 is to enhance its total efficiency for high PAR signals. The efficiency performance of the amplifier circuit arrangement 200 is much better or at least equivalent to a conventional 3-way Doherty power amplifier or known amplifier circuit arrangement described in the introductory part.

The amplifier circuit arrangement 200 comprises a main amplifier circuit 210 having an input In1 for receiving one of the input signals X1 and an output for providing an amplified signal derived from the input signal X1.

The amplifier circuit arrangement 200 further comprises an auxiliary amplifier circuit 221 having an input In2 for receiving another one of the input signals X2 and an output for providing an amplified signal derived from the input signal X2.

The amplifier circuit arrangement 200 further comprises a negative resistance amplifier circuit 222 having a reflection coefficient greater than or equal to 1.

Each of the auxiliary amplifier circuit 221 and negative resistance amplifier circuit 222 is selectively operable to operate in combination with the main amplifier circuit 210.

The amplifier circuit arrangement 200 further comprises a single hybrid coupler 230. The hybrid coupler 230 comprises a first port 231 being coupled to the output of the main amplifier circuit 210, a second port 232 being coupled to the output of the auxiliary amplifier circuit 221, a third port 233 being coupled to the negative resistance amplifier circuit 222 and a fourth port 234 being coupled via output terminal 245 to a load 240.

In a preferred embodiment, the first port 231 is the primary input and the second port 232 is the CSP or reverse input of the hybrid coupler 230. The third port 233 is a silent port without any terminal for an externally generated input signal. The fourth port 234 which forms the only output of the hybrid coupler 230 is connected to the output terminal 245.

The negative resistance amplifier 222 is configured to receive a signal X3 from the hybrid coupler 230 via the third port 233 and to return or reflect a suitably amplified signal X3' thereof back to the third port 233 of the hybrid coupler 230.

As illustrated in FIG. 1, the amplifier circuit arrangement 200 uses only one single hybrid coupler 230 instead of multiple couplers or coupling structures to achieve e.g. 3-way Doherty amplifier operation. The output power from the main amplifier circuit 220, auxiliary amplifier circuit 221 and negative resistance amplifier circuit 222 are individually injected into the first, second and third ports 231, 232, 233 of the hybrid coupler 230. The combined power is delivered to the load 240 via output terminal 245 in the form of an output signal X4 from the fourth port 234 of the hybrid coupler 230.

According to some preferable, but not necessary embodiments herein, the hybrid coupler 230 is a quadrature hybrid coupler and in particular a 3-dB quadrature hybrid coupler with four ports 231-234, as shown in FIG. 1. Any one of these four ports 231-234, i.e. input port IN, In-phase output port '0', isolation port ISO and quadrature output port '-90', can be selected arbitrarily as a first port 231. After the first port 231 is selected, the second, third and fourth ports 232-234 will be uniquely defined.

For example, in the case shown in FIG. 1, the input port IN is selected as the first port 231, which is coupled to the main amplifier circuit 210. Then the isolation port ISO which is isolated from the input port IN will be the second port 232 and is coupled to the output of the auxiliary amplifier circuit 221. The In-phase output port '0' which has a 0 degree transfer from the input port IN will be the third port 233 and is coupled to the output of the negative resistance amplifier circuit 222. And last but not least, the quadrature output port '-90' which has a –90 degree transfer from the input port IN will be the fourth port 234 and is coupled to the load 240.

For another example, if the In-phase output port '0' is selected as the first port 231, which is coupled to the main amplifier circuit 210. Then the quadrature output port '-90' will be the second port 232 and is coupled to the output of the auxiliary amplifier circuit 221. The input port IN will then be the third port 233 and is coupled to the output of the negative resistance amplifier circuit 222. And the isolation port ISO will be the fourth port 234 and is coupled to the load 240.

For a third example, if the quadrature output port '-90' is selected as the first port 231, which is coupled to the main amplifier circuit 210. Then the In-phase output port '0' will be the second port 232 and is coupled to the output of the auxiliary amplifier circuit 221. The isolation port ISO will be then the third port 233 and is coupled to the output of the negative resistance amplifier circuit 222. And the input port IN will be the fourth port 234 and is coupled to the load 240.

For a last example, if the isolation port ISO is selected as the first port 231, which is coupled to the main amplifier circuit 210. Then the input port IN will be the second port

232 and is coupled to the output of the auxiliary amplifier circuit 221. The quadrature output port '-90' will be the third port 233 and is coupled to the output of the negative resistance amplifier circuit 222. And the In-phase output port '0' will be the fourth port 234 and is coupled to the load 240.

According to some further embodiments, the hybrid coupler 230 may be constructed as a Branch-line coupler, a lumped elements coupler, a coupled-line coupler or a Lange coupler. For example, a Branch-line coupler is made from 4 pieces of transmission lines. A coupled-line coupler is made from 2 pieces of mutually coupled transmission lines. A lumped element coupler is made from inductors and capacitors. Lange couplers are made from interleaved multiple sections of coupled transmission lines.

Hereinafter several exemplary embodiments of the circuit implementation of a negative resistance amplifier circuit 222 are shown and described with regard to FIGS. 2A-2E.

According to a first embodiment shown in FIG. 2A, the negative resistance amplifier circuit 222 is a reflection amplifier 250.

According to a second embodiment shown in FIG. 2B, the negative resistance amplifier circuit 222 is realized as a simple IMPATT diode 260. The IMPATT diode 260 is a passive, two-port electrical element where one of these ports is connected to the p-side and the other port is connected to the n-side of the IMPATT diode 260. The IMPATT diode 260 here forms a circuit termination against a reference potential 261, which in the example shown in FIG. 2B is the potential of reference ground 261.

According to a third embodiment shown in FIG. 2C, the negative resistance amplifier circuit 222 comprises a three-port circulator 270 and two reflection amplifiers 271, 272. The input port A1 of the circulator 270 is connected to the third port 233 of the hybrid coupler 230 for receiving the signal X3. The circulator 270 further comprises two other ports A2, A3 which are each connected to respective reflection amplifier 271, 272. For a three-port circulator 270 shown in FIG. 2C, an input signal X3 applied to port A1 only comes out of port A2, an input signal applied to port A2 only comes out of port A3, and art input signal applied to port A3 only comes out of port A1 As such, at port A1 a suitably amplified reflection signal X3' which is derived from the input signal X3 by means of the reflection amplifiers 271, 272 is provided and applied to the third port 233 of the hybrid coupler 230.

Preferably, the reflection amplifiers 271, 272 can in designed as IMPATT diodes.

In another embodiment not shown in the drawing, the circulator 270 used for the resistance amplifier circuit 222 may be designed as a four-port circulator which comprises three reflection amplifiers. This embodiment would result in an even higher gain.

According to a fourth embodiment shown in FIG. 2D, the negative resistance amplifier circuit 222 comprises a plurality of three-port circulators 270 and reflection amplifiers 271, 272. A circulator 270 and one of the reflection amplifiers 271 which is connected to the second port of a circulator 270 form a reflection pair 273. Adjacently arranged circulators 270 are coupled together via their first and third ports A1, A3, respectively. The reflection amplifiers 272 forms the circuit termination. The plurality of reflection pairs 273 are connected in series in a Daisy chain configuration.

According to a fifth embodiment shown in FIG. 2E, the negative resistance amplifier circuit 222 comprises a control terminal 280 for receiving a control signal X5. In this preferred embodiment, the negative resistance amplifier circuit 222 is programmable so that its gain is adjustable or setable depending on the received control signal X5.

FIG. 3 shows a schematic block diagram illustrating an amplifier circuit arrangement according to a further aspect.

The amplifier circuit arrangement 200 may comprise in this embodiment one or more output matching networks OMN1, OMN2, OMN3, OMN4. Each output matching network OMN1, OMN2, OMN3, OMN4 is coupled to a respective one of the four ports 231-234 of the hybrid coupler 230 to perform impedance transformation.

Preferably, a characteristic impedance of the hybrid coupler 230 is configured to match a loading impedance of the load 240.

Preferably, but not necessarily, at least one of the output matching networks OMN1, OMN2, OMN3, OMN4 may comprise transmission lines, such as strip lines, micro-strip lines and coplanar waveguide, or lumped elements, such as capacitors and inductors.

To explain the functionality of the amplifier arrangement 200, a particular embodiment, where the hybrid coupler 230 is a 3-dB quadrature hybrid coupler 230 is discussed in the following.

FIG. 4 shows a schematic block diagram illustrating a more detailed amplifier circuit arrangement according to a further aspect.

The main amplifier circuit 210 and the auxiliary amplifier circuits 221 may be implemented by transistors T1, T2, respectively. Transistors T1, T2 may be any of a high electron mobility transistor (HEMT), a heterojunction bipolar transistor (HBT), a laterally-diffused metal-oxide semiconductor (LDMOS) transistor or any other suitable transistor. These transistors T1, T2 may be made of a suitable semiconductor material, such as Gallium nitride (GaN), Silicon (Si), Gallium arsenide (GaAs), Silicon carbide (SiC), Indium phosphide (InP) or the like.

The transistors T1, T2 are switched by a suitable control signal which is applied to respective control terminals of transistors T1, T2 using a control circuit 290, 291.

The load path of transistor T1 is connected between reference ground and the first port 231 of the hybrid coupler 230. Similarly, the load path of transistor T2 is connected between reference ground and the second port 232. A charging circuit comprising two capacitors and an inductor coupled to a voltage supply 292 is arranged between the respective output terminals of the two transistors T1, T2 and the respective first and second ports 231, 232.

FIG. 5 shows a schematic block diagram illustrating an amplifier circuit arrangement according to a further aspect.

The amplifier circuit arrangement 200 in this example is a single-input-single-output amplifier. The amplifier circuit arrangement 200 comprises a power splitter 750. The power splitter 750 is configured to split the single input signal X0 at an terminal input IN into two split input signals X1, X2 and to feed each split input signal X1, X2 to the respective input In1, In2 of the main and auxiliary amplifier circuits 210, 221.

Preferably, but not necessarily, the power splitter 750 is an uneven 3-way Wilkinson splitter 750.

FIG. 6 shows a schematic block diagram illustrating an amplifier circuit arrangement according to a further aspect.

The amplifier circuit arrangement 200 comprises in this example a power detector 820. The power detector 820 is configured to sense the power of the RF input signal X0. The power detector 820 is further configured to control the power of the driving signals to the main and second auxiliary amplifier circuits 210, 221. For example, the amplifier circuit arrangement 200 may comprise drive amplifiers 832,

833 each being configured to receive a splitted RF input signal and to amplify the splitted RF input signal to a drive signal with a certain gain, and to provide or to apply the drive signals to the main and second auxiliary amplifier circuits 210, 221, respectively. The output signal from the power detector 820 then may control the gain of the drive amplifiers 832, 833.

In this respect, the power detector 820, the power splitter 750 and the variable-gain amplifiers 832, 833 may be defined as signal processing component 810. They may be implemented as, for example, analog hardware, digital firmware or software algorithms.

Therefore according to some embodiments herein, the amplifier circuit arrangement 200 may comprise a signal processing component 810 configured to control power of the drive signals and selectively apply the drive signals with a specific gain with respect to the input signal to the main amplifier circuit 210 and the auxiliary amplifier circuit 221 such that the drive signal to the main amplifier circuit 210 has a higher gain for higher level input signals than a gain for lower level input signals, and each of the auxiliary amplifier circuit 221 and negative resistance amplifier circuit 222 is selectively operable to operate in combination with the main amplifier circuit 210.

The amplifier circuit arrangement 200 according to embodiments herein may be employed in various integrated circuits, e.g. monolithic integrated circuits, electronic devices, wired or wireless communication devices, e.g. radio transmitters, radio base stations, mobile stations.

FIG. 7 shows a schematic block diagram illustrating an electronic device 900 according to a further aspect, which may be, e.g. an integrated circuit, a mobile station or a radio base station.

The electronic device 900 comprises a transceiver 930 and a processing unit 940. The transceiver 930 comprises a receiver 910 and a transmitter 920.

In practice, the amplifier circuit arrangement 200 may probably have insufficient linearity for certain applications. In these cases, the system linearity can often be enhanced by digital pre-distortion. Accordingly, the transmitter 920 may further comprise a digital pre-distortion unit 950 connected to the amplifier circuit arrangement 200, as described before with regard to FIGS. 1 to 6.

To conclude, the amplifier circuit arrangements 200 according to embodiments herein have several advantages. The proposed solution employs only one single hybrid coupler 230 which is a single coupling structure to combine power properly from different amplifier circuits.

In printed-circuit board (PCB) implementations, the hybrid coupler 230 may be a 3-dB quadrature type combiner. They are common, commercially available, physically small on high permittivity materials and cheap for manufacturing as surface-mount devices. Accordingly, the amplifier circuit arrangements 200 according to the embodiments described herein may be more compact, less complicated and less expensive. More significantly, in multi media IC implementations, chip-area reducing and cost saving may be 50% more than those 3-way DPAs in prior arts.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections between various elements as shown and described with respect to the drawings may be a type of connection suitable to transfer signals from or to the respective nodes, units or devices, for example via intermediate devices. Accordingly, unless implied or stated otherwise the connections may for example be direct connections or indirect connections.

Because the apparatuses implementing the present invention are, for the most part, composed of electronic components and circuits known to those skilled in the art, details of the circuitry and its components will not be explained in any greater extent than that considered necessary as illustrated above, for the understanding and appreciation of the underlying concepts of the present invention and in order not to obfuscate or distract from the teachings of the present invention.

Also, the invention is not limited to physical devices or units implemented in non-programmable hardware, but can also be applied in programmable devices or units able to perform the desired device functions by operating in accordance with suitable program code. Furthermore, the devices may be physically distributed over a number of apparatuses, while functionally operating as a single device. Devices functionally forming separate devices may be integrated in a single physical device. Those skilled in the art will recognize that the boundaries between logic or functional blocks are merely illustrative and that alternative embodiments may merge logic or functional blocks or impose an alternate decomposition of functionality upon various logic or functional blocks.

In the description, any reference signs shall not be construed as limiting the claim. The word "comprising" does not exclude the presence of other elements or steps then those listed in a claim. Furthermore, the terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage. The order of method steps as presented in a claim does not prejudice the order in which the steps may actually be carried out, unless specifically recited in the claim.

Skilled artisans will appreciate that the illustrations of chosen elements in the drawings are only used to help to improve the understanding of the functionality and the arrangements of these elements in various embodiments of the present invention. Also, common and well understood elements that are useful or necessary in a commercially feasible embodiment are generally not depicted in the drawings in order to facilitate the understanding of the technical concept of these various embodiments of the present invention. It will further be appreciated that certain procedural stages in the described methods may be described or depicted in a particular order of occurrence while those skilled in the art will understand that such specificity with respect to sequence is not actually required.

LIST OF USED REFERENCE SYMBOLS 200 amplifier circuit arrangement
210 main amplifier circuit 221 auxiliary amplifier circuit
222 negative resistance amplifier circuit
230 hybrid coupler
231 first/main port of hybrid coupler
232 second/CSP port of hybrid coupler
233 third/silent port of hybrid coupler
234 fourth/output port of hybrid coupler
240 load
245 output terminal
250 reflection amplifier
260 IMPATT diode
261 reference potential
270 three-port circulator
271, 272 reflection amplifiers
273 reflection pair
280 control terminal
290, 291 control circuits
292 voltage supply
750 power splitter
810 signal processing components
820 power detector
832, 833 drive amplifiers, variable-gain amplifiers
900 electronic device
930 transceiver
910 receiver
920 transmitter
940 processing unit
950 digital pre-distortion unit
A1-A3 ports of circulator
IN input
In1, In2 inputs
OMN1-OMN4 output matching networks
T1, T2 transistors
X0 input signal
X1, X2 input signals
X3 signal
X3' amplified/reflected signal
X4 output signal
X5 control signal

What I claim is:

1. An amplifier circuit arrangement for amplifying at least one input signal to an output signal for delivery to a load, the amplifier circuit arrangement comprising:

at least one four-port hybrid coupler, a main amplifier having an input terminal for receiving a first input signal and being coupled to a first port of the hybrid coupler, an auxiliary amplifier having an input terminal for receiving a second input signal and being coupled to the second port of the hybrid coupler, a negative resistance amplifier circuit being coupled to the third port of the hybrid coupler and having a reflection coefficient greater than or equal to 1, wherein the negative resistance amplifier circuit is configured to receive a signal from the hybrid coupler via the third port and to return an amplified signal thereof back to the third port of the hybrid coupler, wherein at least one of the auxiliary amplifier and the negative resistance amplifier circuit being selectively operable to operate in combination with the main amplifier circuit.

2. The amplifier circuit arrangement of claim 1, further comprising an output terminal connected to the fourth port for providing the output signal and for coupling the amplifier circuit arrangement to the load.

3. The amplifier circuit arrangement of claim 1, wherein the third port is an isolated port of the hybrid coupler.

4. The amplifier circuit arrangement of claim 1, wherein the negative resistance amplifier circuit comprises a first and a second terminal, wherein the first terminal acts as well as input and output terminal of the negative resistance amplifier circuit and wherein the second terminal is coupled to a reference voltage.

5. The amplifier circuit arrangement of claim 1, wherein the negative resistance amplifier circuit comprises a RF reflection amplifier.

6. The amplifier circuit arrangement of claim 1, wherein the negative resistance amplifier circuit comprises at least one IMPATT diode.

7. The amplifier circuit arrangement of claim 1, wherein the negative resistance amplifier circuit comprises at least one circulator circuit that is connected to an output of a reflection amplifier or another circulator circuit.

8. The amplifier circuit arrangement of claim 7, comprising a plurality of circulators and reflection amplifier that are connected in a Daisy chain configuration.

9. The amplifier circuit arrangement of claim 1, further comprising a power splitter configured to split a received input signal into the first input signal and the second input signal and to feed the splitted first and second input signals to the respective input terminals of the main amplifier and auxiliary amplifier, respectively.

10. The amplifier circuit arrangement of claim 9, wherein the power splitter is an uneven 3-way Wilkinson splitter.

11. The amplifier circuit arrangement of claim 1, wherein the hybrid coupler comprises at least one of:

a Branch-line coupler, a lumped elements coupler, a coupled-line coupler, a Lange coupler.

12. The amplifier circuit arrangement of claim 1, wherein the hybrid coupler is a quadrature coupler.

13. The amplifier circuit arrangement of claim 1, wherein the hybrid coupler is a ring hybrid coupler.

14. The amplifier circuit arrangement of claim 1, further comprising at least one matching network, wherein each matching network is coupled to a respective one of the four ports of the hybrid coupler in order to perform impedance transformation, wherein at least one of the matching networks comprises a transmission line or a lumped element.

15. The amplifier circuit arrangement of claim 1, wherein a characteristic impedance of the hybrid coupler is configured to match a loading impedance of the load.

16. The amplifier circuit arrangement of claim 1, further comprising a sharpening filter coupled between the negative resistance amplifier and the third port.

17. The amplifier circuit arrangement of claim 1, wherein the negative resistance amplifier comprises a control terminal for receiving a control signal and wherein the negative resistance amplifier is configured such to set a predetermined magnitude of the reflection coefficient depending on the received control signal.

18. The amplifier circuit arrangement of claim 1, wherein the gain of the negative resistance amplifier is below 3 dB and in particular in the range of 1 dB or below.

19. An electronic device comprising an amplifier circuit arrangement for amplifying at least one input signal to an output signal for delivery to a load, the amplifier circuit arrangement comprising:

at least one four-port hybrid coupler, a main amplifier having an input terminal for receiving a first input signal and being coupled to a first port of the hybrid coupler, an auxiliary amplifier having an input terminal for receiving a second input signal and being coupled to the second port of the hybrid coupler, a negative resistance amplifier circuit being coupled to the third port of the hybrid coupler, wherein the negative resistance amplifier circuit is configured to receive a signal from the hybrid coupler via the third port and to return an amplified signal thereof back to the third port of the hybrid coupler;

wherein at least one of the auxiliary amplifier and the negative resistance amplifier circuit being selectively operable to operate in combination with the main amplifier circuit.

20. The electronic device of claim 19, wherein the electronic device comprises at least on one of:

a radio transmitter, a TV transmitter, a radio base station, a bargaining chip, a broadband amplifier.

* * * * *